United States Patent [19]

Uesato et al.

[11] Patent Number: 5,223,084
[45] Date of Patent: Jun. 29, 1993

[54] SIMULTANEOUS DIELECTRIC PLANARIZATION AND CONTACT HOLE ETCHING

[75] Inventors: Warren M. Uesato, San Jose; Kwang-Leei K. Young, Palo Alto; Hung-Kwei Hu, Saratoga, all of Calif.; Paul K. Aum, Austin, Tex.

[73] Assignee: Hewlett-Packard Company, Palo Alto, Calif.

[21] Appl. No.: 796,732

[22] Filed: Nov. 25, 1991

[51] Int. Cl.⁵ .......................................... H01L 21/302
[52] U.S. Cl. ................................. 156/644; 156/650; 156/651; 437/228; 437/981; 257/774
[58] Field of Search ..................... 156/644, 650, 651; 437/981, 228; 257/774

[56] References Cited

U.S. PATENT DOCUMENTS

| | | | |
|---|---|---|---|
| 4,816,115 | 3/1989 | Hörner et al. | 156/644 |
| 4,879,257 | 11/1989 | Patrick | 437/228 |
| 4,939,105 | 7/1990 | Langley | 437/228 |
| 5,026,666 | 6/1991 | Hills et al. | 437/228 |
| 5,180,689 | 1/1993 | Liu et al. | 437/981 |

FOREIGN PATENT DOCUMENTS

| | | | |
|---|---|---|---|
| 62-156835 | 7/1987 | Japan | 437/981 |
| 63-260134 | 10/1988 | Japan | 437/981 |
| 2-213129 | 8/1990 | Japan | 437/981 |

OTHER PUBLICATIONS

L. Giffen et al., "Silicon Dioxide Profile Control for Contacts and Vias," *Solid State Technology*, Apr., 1989, pp. 55-57.

*Primary Examiner*—Brian E. Hearn
*Assistant Examiner*—Laura M. Holtzman

[57] ABSTRACT

During the manufacture of a semiconductor integrated circuit, contact holes or passages are formed through a non-planar insulating layer resulting from the deposition of dielectric over electrical contacts having differing profile heights from the surface of an internal layer, such as a substrate, to expose these contacts and/or provide electrical connections thereto. The passages are formed with a combination of sloped and vertical sidewall portions in which varying depth sloped portions are used to effectively planarize the dielectric layer and permit the vertical sidewall portions to have substantially identical vertical dimensions. This technique simultaneously exposes contacts with varying profile heights which thereby reduces contact damage. In addition, this technique effectively planarizes the dielectric layer, reducing the need for an additional planarization step.

8 Claims, 2 Drawing Sheets

Prior Art

5,223,084

SIMULTANEOUS DIELECTRIC PLANARIZATION AND CONTACT HOLE ETCHING

BACKGROUND OF THE INVENTION

1. Field of the Invention

This invention generally relates to the formation of openings through a dielectric layer during the fabrication of an integrated circuit, and more particularly to a technique of etching passages with sloped sidewalls through the dielectric layer to expose contacts in an internal layer below the dielectric layer, particularly during the formation of conductive contact holes.

2. Description of the Prior Art

The fabrication of integrated circuits often requires the creation of interconnections between layers, conventionally accomplished by creating electrically conducting passageways or connections through contact holes or vias. Contact holes are conventionally fabricated by placing contacts on an internal layer, including the silicon substrate, covering such internal layer and contacts with an insulating or dielectric layer, etching passages through the dielectric layer to expose the contacts and metalizing the passages to provide electrically conducting paths to the contacts.

Several problems exist with the conventional techniques used for forming such inter layer interconnections, and in particular, with the techniques used for etching the required passages, or passageways. A simplified description of the conventional approach for forming contact holes through a dielectric layer for interconnection to contacts on the surface of a substrate will be described next.

In the formation of such conventional contact holes, the deposition of the dielectric layer normally forms a layer of equal thickness over the surface of the substrate and the contacts. Those contacts having profiles raised above the surface of the substrate create high spots in the top surface of dielectric layer as shown, for example, by high spots 11, 13, and 15 in FIG. 1.

Before the appropriate passages are etched, it is often necessary to planarize the dielectric layer, i.e., to remove elevated areas such as high spots 11, 13, and 15. One common approach to planarizing the dielectric layer is to spin a planar coat of photoresist over the surface of the layer. The photoresist and the high spots of the dielectric layer are then removed together during a reactive ion etch.

The photoresist material utilized is selected to be etchable at the same rate as the dielectric. This permits the planar surface of the photoresist layer to be maintained as the etch removes the high spots of the dielectric. The etch is stopped after all the photoresist has been eroded away and the surface of the dielectric is planar.

Thereafter, to form the passages, another layer of photosensitive, patternable photoresist is applied over the planarized dielectric layer. The photoresist is exposed with a mask related to the contacts, developed and either the exposed, or the unexposed, photoresist is removed. The resulting photoresist pattern exposes the dielectric above the contacts.

An etching process is then used to form passages through the dielectric layer exposing the contacts. Metal is then deposited in the passages in electrical contact with the contacts on the substrate to form the desired electrical connections.

The etching of the patterned photoresist and the dielectric layer is controlled to form the passages with a predetermined sidewall configuration in the same general manner as shown, for example, by sloped sidewall portion 29 and vertical sidewall portion 27 in FIG. 5. This combination of sloped and vertical sidewalls has been found to be beneficial during the subsequent metal deposition step.

There are several problems associated with such conventional techniques. In general, the planarization required to compensate for contacts having differing raised profiles makes it difficult to consistently etch the passages with properly configured sidewalls and without harmfully affecting the contacts by over-etching.

In particular, after conventional planarization, the dielectric layer will be of differing thicknesses over contacts of differing profile heights above the substrate. The higher profile contacts will be closer to the surface of the dielectric. During etching, contacts closest to the surface are exposed first. As the etching process is continued to expose the remaining contacts, the first exposed contacts may become over-etched, resulting in high contact resistance.

Another problem with the current techniques is the over-etching of passage sidewalls. The over-etching of sidewalls may cause the loss of desired sidewall configuration. The conventionally desired sidewall configuration includes a vertical sidewall near the contact and a sloped sidewall outward therefrom to the dielectric surface, in the general shape of an inverted funnel or frustum, as discussed above with reference to FIG. 5. Overetching can cause the loss of the vertical portion of the sidewall.

With contacts of varying profile heights, the use of the conventional techniques are limited because it is difficult to control over-etching of the shallower contacts, and/or verticality of the sidewalls near these contacts. These restrictions mandate very narrow manufacturing process margins. As a result, the conventional techniques are relatively expensive and have limited application.

What is needed is a technique which reliably and inexpensively forms contact holes on planarized dielectric with properly configured passageways through the dielectric layer to contacts of varying profile heights on the substrate or other internal layer.

SUMMARY OF THE INVENTION

The preceding and other problems with the conventional techniques are addressed and overcome by the present invention which provides, in a first aspect, a technique for creating a series of passageways, or contact holes, in a semiconductor integrated circuit. Each such passageway is configured with sloped and vertical sidewall portions exposing contacts on an internal layer, such as a substrate, through a dielectric layer.

The sloped portions of the passageways are formed during the same process step, but vary in depth in order to provide effective planarization for high spots caused by contacts with different profile heights above the internal layer. The bottom of each sloped sidewall portion is a constant distance above its associated contact, regardless of the contact profile height. The vertical sidewall portions extending from the bottom of the sloped sidewall portions to each corresponding contact all therefore have substantially the same vertical dimension, permitting the etching step creating such vertical sidewall portions to simultaneously expose the contacts, avoiding contact damage and/or sloping of the vertical sidewalls by over-etching.

In a process to realize the present invention, a photoresist layer is first coated over the dielectric layer and patterned to correspond with the contacts on the internal layer. Then an etching step forms an initial opening in the surface of the dielectric layer with substantially vertical sidewalls. Another etching step then planarizes the dielectric by simultaneously etching photoresist and dielectric. Etching is continued until dielectric is removed in the contact hole.

The relatively high etch rate erodes the initial opening and deepens it, forming a first portion of the passage with sloping sidewalls. The sloping sidewalls are formed due to a continuing erosion of the opening in the photoresist. As the photoresist opening is enlarged, it exposes and permits the etching of an expanding concentric area of dielectric around the initial opening in the dielectric layer. This process results in the formation of the desired sidewall frustum shape.

In another aspect, the present invention provides a method of forming a plurality of passageways exposing internal contacts in a semiconductor integrated circuit, by forming a dielectric layer above a plurality of internal contacts in a semiconductor integrated circuit, forming an initial opening with substantially vertical sidewalls in said dielectric layer above each said internal contact, further etching each said initial opening at a first predetermined rate to form sloped, incomplete passageways to each said contact, the thickness of dielectric remaining above each said contact being substantially the same, and completing each such passageway through the remaining dielectric at a second, slower predetermined rate to substantially simultaneously expose each such internal contact.

These and other features and advantages of this invention will become further apparent from the detailed description that follows, which is accompanied by one or more drawing figures. In the figures and description, numerals indicate the various features of the invention, like numerals referring to like features throughout both the drawings and the description.

DETAILED DESCRIPTION OF THE PREFERRED EMBODIMENT

The present invention provides a technique for the formation of passages through a dielectric layer during the fabrication of contact holes in a semiconductor integrated circuit. The passages are formed to expose contacts, which are normally mounted in or on an internal layer, such as a silicon substrate. The technique may be used to form passages to expose contacts of differing profile heights above the substrate without over-etch damage to either the contacts or the passage sidewalls. During the formation of the passages, the contacts are protected from being over etched through the use of a multi-step etching technique.

The etching first forms an opening with vertical sidewalls in the dielectric above the contacts. Etching then continues in order to erode photoresist and dielectric at approximately equal rates to planarize the dielectric surface. The resist erosion during this etch step results in a sloped sidewall. The slower etch rate reduces the risk of over-etching the contacts during the final etch. The techniques of the present invention planarize the dielectric layer during the etching process, reducing manufacturing costs by eliminating planarization of the dielectric layer as a separate step.

Figure 1:
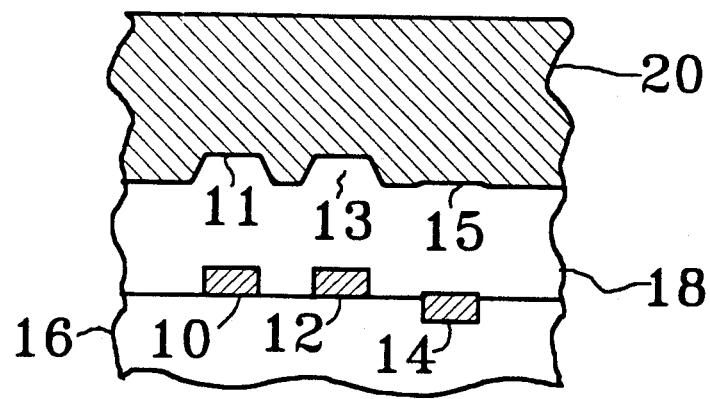
FIG. 1 is a cross-sectional view of a semiconductor integrated circuit during fabrication showing a substrate and contacts of differing profile heights covered by a layer of dielectric and a layer of photoresist in accordance with both the prior art and a preliminary step in the process of the present invention.

Referring now to FIG. 1, a sectional view of a portion of a semiconductor integrated circuit is shown during fabrication in accordance with both the prior art as well as the principals of the present invention. Contacts 10, 12, and 14 are mounted on or in an internal layer of the integrated circuit, such as substrate 16. Dielectric layer 18 is applied using conventional techniques to overlie contacts 10, 12, and 14 and substrate 16.

High spots 11, 13, and 15 are normally formed in dielectric layer 18 due to the varying profile height above substrate 16 of contacts 10, 12, and 14, respectively. The surfaces of high spots 11, 13, and 15 are approximately equidistant from the respective surfaces of contacts 10, 12, and 14.

Using conventional techniques, photoresist layer 20 is applied over dielectric layer 18 covering high spots 11, 13, and 15. photoresist layer 20 is selected to be etchable at about the same rate as dielectric layer 18 during the planarizing etch step.

Figure 2:
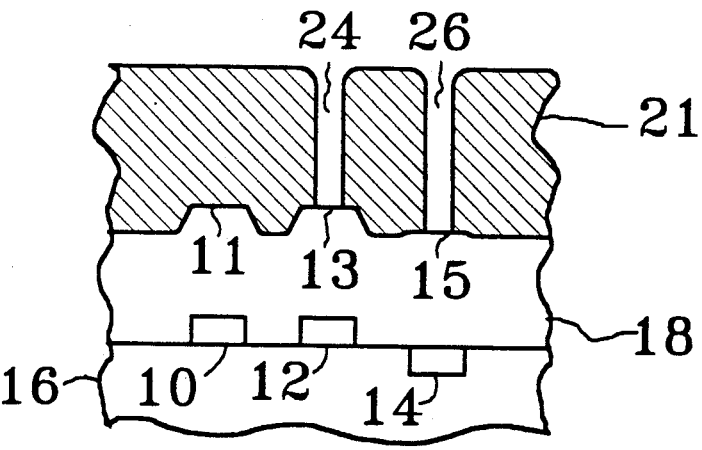
FIG. 2 is the structure shown in FIG. 1 after patterning of the photoresist layer.

Referring now to FIG. 2, photoresist pattern 21 is formed in photoresist layer 20 to expose the portions of dielectric layer 18 over contacts 12, and 14, that is, portions of high spots 13, and 15. photoresist pattern 21 is formed by masking, exposing, developing and removing the exposed photoresist from photoresist layer 20 or in any other conventional manner. Openings 24 and 26 are thus formed over spots 13, and 15 and therefore over contacts 12, and 14, respectively.

Four etching steps are then performed with an etching system, such as a conventional reactive ion etcher, not shown. A short etch, such as an oxygen etch, is first performed to remove any residual photoresist remaining inside photoresist openings 24 and 26. Minimal photoresist is removed so that the dimensions of photoresist pattern 21 remain effectively unchanged. The remaining three etching steps may be performed with an ion plasma etch using techniques well known in the art.

Figure 3:
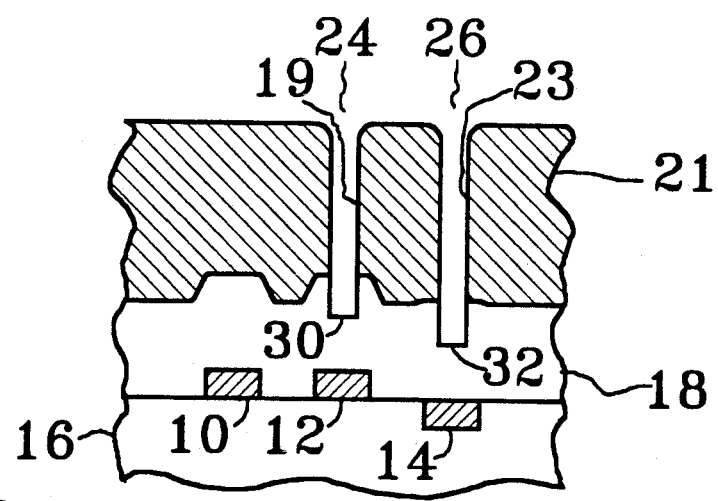
FIG. 3 is the structure shown in FIG. 2 after an initial passage opening etch.

Referring now to FIG. 3, dielectric layer 18 is etched, by an appropriate technique such as a vertical ion plasma etch, through photoresist openings 24 and 26 to form the initial openings of passages 30 and 32. As a result of this etching step, photoresist openings 24 and 26 and initial openings of passages 30 and 32 have nearly vertical sidewalls 19 and 23.

Figure 4A:
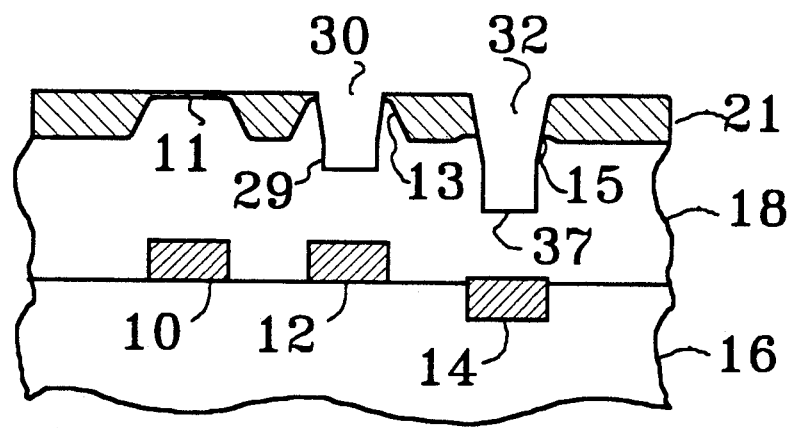
FIG. 4A and FIG. 4B show the structure shown in FIG. 3 after further etching with the planarization etch.

Referring now to FIG. 4A, photoresist pattern 21 and dielectric layer 18 are then simultaneously etched at a relatively high rate, by for example, a conventional planar ion plasma etch. As photoresist openings 24 and 26 are eroded by this etch, concentric portions of dielectric layer 18 around passages 30 and 32 are exposed. The upper portions of passages 30 and 32 are thereby eroded, forming sloping sidewall portions 29 and 37 in passages 30 and 32, respectively.

Figure 4B:
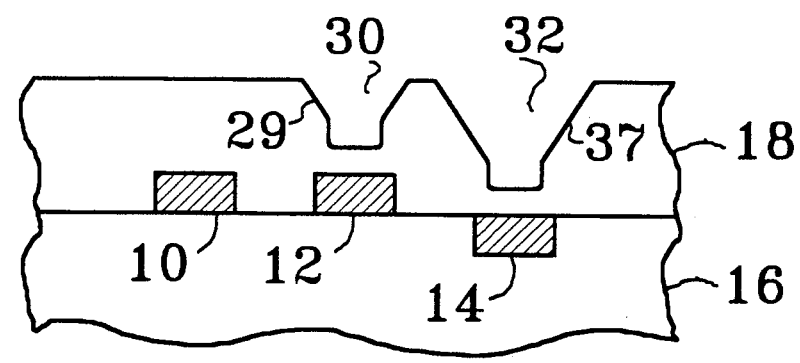

Referring now to FIG. 4B, the simultaneous etching of photoresist pattern 21 and dielectric layer 18 is allowed to continue until dielectric layer 18 is planarized. High spots 11, 13, and 15 have been completely eroded away and high spots 13 and 15 have been opened up to form sloped sidewalls 29 and 37 of passages 30 and 32.

Since contacts 12 and 14 would be attacked by this etch if exposed, the etching process is stopped before contacts 12 and 14 are exposed.

Figure 5:
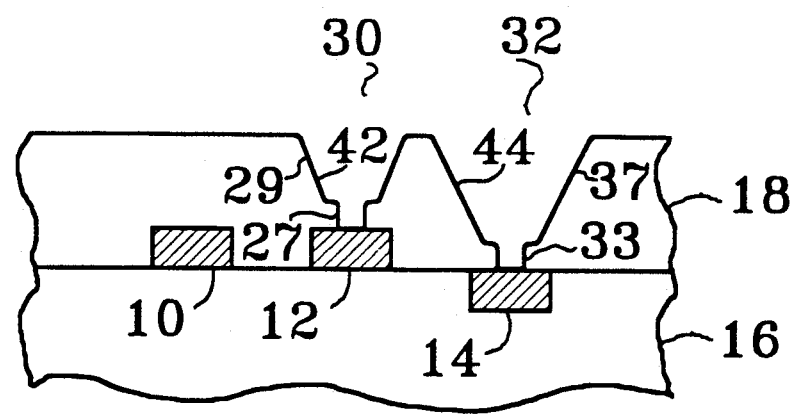
FIG. 5 shows the structure shown in FIG. 4 after the final portion of the passages have been etched.

As shown in FIG. 5, a final etch is then performed at a relatively slower rate. This may be accomplished, for example, by reducing the bias voltage setting of the reactive ion etcher. The final etch completes the formation of passages 30 and 32, as shown in FIG. 5. After contacts 12 and 14 have been fully exposed, the etch is stopped.

This completes the formation of contact holes, such as passages 30 and 32, used for exposing contacts 12 and 14 during the simultaneous planarization of dielectric layer 18 to remove high spots 11, 13, and 15. It should be noted that high spots 11, formed over contact 10, is removed during planarization even though contact 10 is not exposed during the formation of a contact hole there over.

The process margins of this technique are relatively broad as contacts 12 and 14 are exposed at approximately the same time. This may be seen clearly in FIG. 5 with respect to the equal or nearly equal heights of vertical sidewall portions 33 and 27. The nearly simultaneous exposure of contacts 12 and 14 also insures that sloping sidewalls portions 29 and 37 are not over-etched and that vertical sidewalls portions 33 and 27 are preserved.

A conventional metalization step may then be applied to deposit metalized conductors in passages 30 and 32, including both sloping sidewall portions 29 and 37 and vertical sidewall portions 33 and 27, respectively, to form conducting contact holes 42 and 44. Electrical connection through dielectric layer 18 to contacts 12 and 14 on substrate 16 is then provided by conducting contact holes 42 and 44.

The simultaneous planarization of dielectric layer 18 during the formation of passages 30 and 32 eliminates the need for a separate dielectric layer planarization step and its associated costs. Manufacturability is improved due to the relatively wide process margins and reduced fabrication costs.

While the present invention has been described with reference to its presently preferred embodiment, its scope is not limited thereto. Rather, such scope is only limited insofar as defined by the following set of claims and all equivalents thereof.

What is claimed is:

1. A method of forming a plurality of contact holes exposing internal contacts in a semiconductor integrated circuit, comprising the steps of:

forming a dielectric layer above a plurality of internal contacts in a semiconductor integrated circuit;

etching an initial opening with substantially vertical sidewalls in said dielectric layer above each of said plurality of internal contacts, then;

further etching each said initial opening at a first predetermined rate to form sloped, incomplete passageways to each said contact, the thickness of dielectric remaining above each of said plurality of contacts being substantially the same, said further etching step simultaneously planarizing said dielectric layer; and completing each such passageway through the remaining dielectric at a second, slower predetermined rate to substantially simultaneously expose each of said plurality of internal contacts.

2. The method of claim 1 wherein each of said plurality of contacts has a differing vertical profile above a common internal layer.

3. The method of claim 2 wherein the step of forming an initial opening above each of said plurality of internal contacts further comprises the preliminary steps of:

applying a layer of photoresist on said dielectric layer;

patterning said photoresist to form an opening therethrough above each of said plurality of internal contacts; and etching each said initial dielectric opening through each said resist opening.

4. The method of claim 3 wherein the step of further etching each said initial opening to form sloped, incomplete passageways to each of said plurality of contacts further comprises the step of:

simultaneously etching said resist and said dielectric in each said opening.

5. The method of claim 3 wherein the step of etching each said initial dielectric opening through each said resist opening further comprises the step of:

cleaning each said opening in said photoresist layer with an oxygen etch.

6. The method of claim 1 wherein the step of forming an initial opening above each of said plurality of internal contacts further comprises the step of:

etching the dielectric through the photoresist opening with a vertical ion plasma etch.

7. The method of claim 1 wherein the step of further etching each said initial opening further comprises the step of:

further etching each said initial opening with a planar ion plasma etch at a first bias voltage.

8. The method of claim 7 wherein the step of completing each such passageway to expose each of said plurality of internal contacts further comprises the step of:

etching each such passageway with a planar ion plasma etch at a second bias voltage, lower than said first bias voltage.

* * * * *